US009607113B1

(12) United States Patent
Ciolfi et al.

(10) Patent No.: US 9,607,113 B1
(45) Date of Patent: *Mar. 28, 2017

(54) LINKING OF MODEL ELEMENTS TO SPATIAL ELEMENTS

(71) Applicant: The MathWorks, Inc., Natick, MA (US)

(72) Inventors: John E. Ciolfi, Wellesley, MA (US); Pieter J. Mosterman, Framingham, MA (US); Jay R. Torgerson, Hopkinton, MA (US); Daniel F. Higgins, Hopkinton, MA (US); Paul F. Kinnucan, Milton, MA (US)

(73) Assignee: The MathWorks, Inc., Natick, MA (US)

( * ) Notice: Subject to any disclaimer, the term of this patent is extended or adjusted under 35 U.S.C. 154(b) by 359 days.

This patent is subject to a terminal disclaimer.

(21) Appl. No.: 13/730,198

(22) Filed: Dec. 28, 2012

Related U.S. Application Data

(63) Continuation-in-part of application No. 13/533,841, filed on Jun. 26, 2012, now Pat. No. 9,117,039.

(51) Int. Cl.
| G05B 23/00 | (2006.01) |
| G06F 17/50 | (2006.01) |
| G05B 23/02 | (2006.01) |
| G06T 15/00 | (2011.01) |

(52) U.S. Cl.
CPC ..... *G06F 17/5009* (2013.01); *G05B 23/0267* (2013.01); *G06T 15/00* (2013.01)

(58) Field of Classification Search
None
See application file for complete search history.

(56) References Cited

U.S. PATENT DOCUMENTS

| 6,028,593 | A | * | 2/2000 | Rosenberg et al. | ........... 345/156 |
| 7,464,373 | B1 | | 12/2008 | Yunt et al. | |
| 7,523,023 | B1 | | 4/2009 | Koh et al. | |
| 7,925,611 | B1 | * | 4/2011 | Bromley | ............... G05B 19/409 |
| | | | | | 706/11 |

(Continued)

OTHER PUBLICATIONS

Nishino et al., "A Virtual Environment for Modeling 3D Objects Through Spatial Interaction," IEEE International Conference on Systems, Man, and Cybernetics, IEEE SMC'99 Conference Proceedings, vol. 6, 1999, pp. 81-86.

(Continued)

*Primary Examiner* — Kibrom K Gebresilassie
(74) *Attorney, Agent, or Firm* — Harrity & Harrity, LLP

(57) ABSTRACT

A device may include a processor and a memory. The processor may receive a request to link a model element, of a model, and a spatial element. The model, when executed, simulates behavior of a system, and the spatial element is a physical object or an object that is rendered for display in two or more dimensions. The processor may further receive information identifying the model element, receive information identifying the spatial element, and create a link between the identified model element and the identified spatial element based on the received request. The link may allow at least one of the model element to be identified based on identification of the spatial element, or the spatial element to be identified based on identification of the model element. The memory may store the link.

24 Claims, 14 Drawing Sheets

(56) References Cited

U.S. PATENT DOCUMENTS

| | | | |
|---|---|---|---|
| 8,954,187 B1* | 2/2015 | Mylet | G06Q 10/10 209/629 |
| 8,954,195 B2* | 2/2015 | Summer et al. | 700/264 |
| 9,245,068 B1* | 1/2016 | Mosterman | G06F 17/5018 |
| 2001/0037190 A1 | 11/2001 | Jung | |
| 2002/0010655 A1* | 1/2002 | Kjallstrom | 705/27 |
| 2002/0080139 A1* | 6/2002 | Koo et al. | 345/473 |
| 2003/0093768 A1* | 5/2003 | Suzuki | G06F 3/1204 717/100 |
| 2004/0083451 A1* | 4/2004 | Abowd | G06F 17/5009 717/106 |
| 2005/0044372 A1 | 2/2005 | Aull et al. | |
| 2005/0105793 A1* | 5/2005 | Sorek et al. | 382/154 |
| 2005/0256694 A1 | 11/2005 | Taylor | |
| 2005/0257195 A1 | 11/2005 | Morrow et al. | |
| 2005/0278162 A1 | 12/2005 | Ciolfi et al. | |
| 2006/0008151 A1 | 1/2006 | Lin et al. | |
| 2006/0038816 A1* | 2/2006 | Guest et al. | 345/419 |
| 2006/0068910 A1* | 3/2006 | Schmidt | A63F 13/10 709/203 |
| 2006/0150149 A1 | 7/2006 | Chandhoke et al. | |
| 2006/0167667 A1* | 7/2006 | Maturana | G05B 17/02 703/6 |
| 2006/0199167 A1* | 9/2006 | Yang et al. | 434/365 |
| 2008/0007568 A1* | 1/2008 | Chou et al. | 345/629 |
| 2008/0013793 A1* | 1/2008 | Hillis et al. | 382/114 |
| 2008/0037571 A1* | 2/2008 | Hetzel | H04L 12/2805 370/408 |
| 2008/0040703 A1* | 2/2008 | Englehart | G06F 8/10 717/104 |
| 2008/0062167 A1 | 3/2008 | Boggs et al. | |
| 2008/0098349 A1* | 4/2008 | Lin | G06F 8/10 717/106 |
| 2008/0189638 A1* | 8/2008 | Mody | G05B 19/0426 715/771 |
| 2009/0015663 A1* | 1/2009 | Doettling | F16P 3/14 348/46 |
| 2009/0036750 A1* | 2/2009 | Weinstein | G06F 19/322 600/300 |
| 2009/0058799 A1* | 3/2009 | Huang et al. | 345/156 |
| 2009/0061404 A1* | 3/2009 | Toly | 434/262 |
| 2009/0073034 A1* | 3/2009 | Lin | 342/357.07 |
| 2009/0089031 A1* | 4/2009 | Sturrock | G06F 17/5009 703/7 |
| 2009/0157478 A1* | 6/2009 | Yang | G06Q 30/0201 705/7.29 |
| 2009/0292514 A1 | 11/2009 | McKim et al. | |
| 2009/0315841 A1* | 12/2009 | Cheng et al. | 345/173 |
| 2010/0009308 A1* | 1/2010 | Wen et al. | 433/24 |
| 2011/0032255 A1* | 2/2011 | Favier et al. | 345/420 |
| 2011/0040392 A1 | 2/2011 | Hamann et al. | |
| 2011/0060463 A1* | 3/2011 | Selker | G05B 23/0221 700/266 |
| 2011/0106339 A1* | 5/2011 | Phillips et al. | 701/2 |
| 2011/0154243 A1 | 6/2011 | Styga et al. | |
| 2011/0205341 A1* | 8/2011 | Wilson et al. | 348/51 |
| 2011/0261083 A1* | 10/2011 | Wilson | 345/676 |
| 2012/0007891 A1 | 1/2012 | Chiang | |
| 2012/0095575 A1* | 4/2012 | Meinherz | G05B 19/409 700/79 |
| 2012/0239169 A1 | 9/2012 | Smith et al. | |
| 2012/0254830 A1 | 10/2012 | Conrad et al. | |
| 2012/0276993 A1* | 11/2012 | Lerner et al. | 463/31 |
| 2012/0317501 A1* | 12/2012 | Milou | 715/753 |
| 2012/0320080 A1* | 12/2012 | Giese et al. | 345/619 |
| 2013/0177235 A1* | 7/2013 | Meier | G06T 15/00 382/154 |
| 2013/0332119 A1* | 12/2013 | Santiquet et al. | 703/1 |
| 2014/0108559 A1 | 4/2014 | Grochowicz et al. | |
| 2014/0122028 A1 | 5/2014 | Aberg | |
| 2014/0132594 A1* | 5/2014 | Gharpure et al. | 345/419 |
| 2014/0157129 A1* | 6/2014 | Dinshaw et al. | 715/728 |
| 2014/0163930 A1* | 6/2014 | Balon et al. | 703/1 |
| 2014/0180644 A1* | 6/2014 | Maturana | G05B 17/02 703/1 |
| 2014/0208272 A1* | 7/2014 | Vats et al. | 715/852 |
| 2014/0241347 A1 | 8/2014 | Yadav et al. | |
| 2014/0247260 A1* | 9/2014 | Ghoneima et al. | 345/419 |
| 2014/0317594 A1 | 10/2014 | He et al. | |
| 2014/0327670 A1* | 11/2014 | Chen | G06T 19/003 345/420 |
| 2014/0365199 A1 | 12/2014 | Mosterman et al. | |
| 2015/0100179 A1* | 4/2015 | Alaniz | A63F 13/00 701/1 |

OTHER PUBLICATIONS

Laviola et al., "3D Spatial Interaction: Applications for Art, Design, and Science," SIGGRAPH 2011 Course, 2011, 75 pages.

Izadi et al., "KinectFusion: Real-time 3D Reconstruction and Interaction Using a Moving Depth Camera," Proceedings of the 24th annual ACM symposium on User interface software and technology, ACM, Oct. 16-19, 2011, pp. 559-568.

Piekarski et al, "Integrated Head and Hand Tracking for Indoor and Outdoor Augmented Reality," Virtual Reality Proceedings, IEEE, 2004, 8 pages.

Tom Simonite, "Microsoft Has an Operating System for Your House", http://www.technologyreview.com/news/517221/microsoft-has-an-operating-system-for-your-house/?utm_campaign=newsletters&utm_source=newsletter-weekly-computing&utm_medium=email&utm_content=20130718, Jul. 18, 2013, 8 pages.

Microsoft, "Microsoft Research: The Lab of Things", http://www.lab-of-things.com/, Jun. 16, 2013, 1 page.

Microsoft, "Faculty Summit 2013", http://research.microsoft.com/en-us/events/fs2013/, Jul. 16.2013, 2 pages.

Microsoft, "HomeOS: Enabling smarter homes for everyone", http://research.microsoft.com/en-us/projects/homeos/, Jun. 22, 2011, 3 pages.

Wikipedia, "Plug and play," http://en.wikipedia.org/wiki/Plug_and_play, Dec. 29, 2014, 6 pages.

Lee et al., "Immersive modeling system (IMMS) for personal electronic products using a multi-modal interface," Computer-Aided Design 42.5, 2010, pp. 387-401.

Ohshima et al., "A Mixed Reality System with Visual and Tangible Interaction Capability—Application to Evaluating Automobile Interior Design -," Proceedings of the Second IEEE and ACM International Symposium on Mixed and Augmented Reality, IEEE Computer Society, 2003, 2 pages.

McKinney et al., "Interactive 4D-CAD," Proceedings of the third Congress on Computing in Civil Engineering, ASCE, Anaheim, CA, Jun. 1996, 9 pages.

Kordon et al., "Model-Based Engineering Design Plots at JPL," IEEEAC paper #1678, Version 11, 2007, 21 pages.

Co-pending U.S. Appl. No. 14/611,773 entitled "Automatic Generation of Models From Detected Hardware" filed Feb. 2, 2015, by Mosterman et al., 66 pages.

Wikipedia, "3D printing" http://en.wikipedia.org/wiki/3D_printing, May 25, 2012, 9 pages.

Co-pending U.S. Appl. No. 13/533,841 entitled "Generating a Three-Dimensional (3D) Report, Associated With a Model, From a Technical Computing Environment (TCE)" filed Jun. 26, 2012, by Mosterman et al., 80 pages.

Co-pending U.S. Appl. No. 13/730,159 entitled "Altering an Attribute of a Model Based on an Observed Spatial Attribute" filed Dec. 28, 2012, by Mosterman et al., 51 pages.

Co-pending U.S. Appl. No. 13/730,092 entitled "Generic Human Machine Interface for a Graphical Model" filed Dec. 28, 2012, by Mosterman et al., 59 pages.

Co-pending U.S. Appl. No. 13/730,279 entitled "Interacting With a Model Via a Three-Dimensional (3D) Spatial Environment" filed Dec. 28, 2012, by Mosterman et al., 75 pages.

* cited by examiner

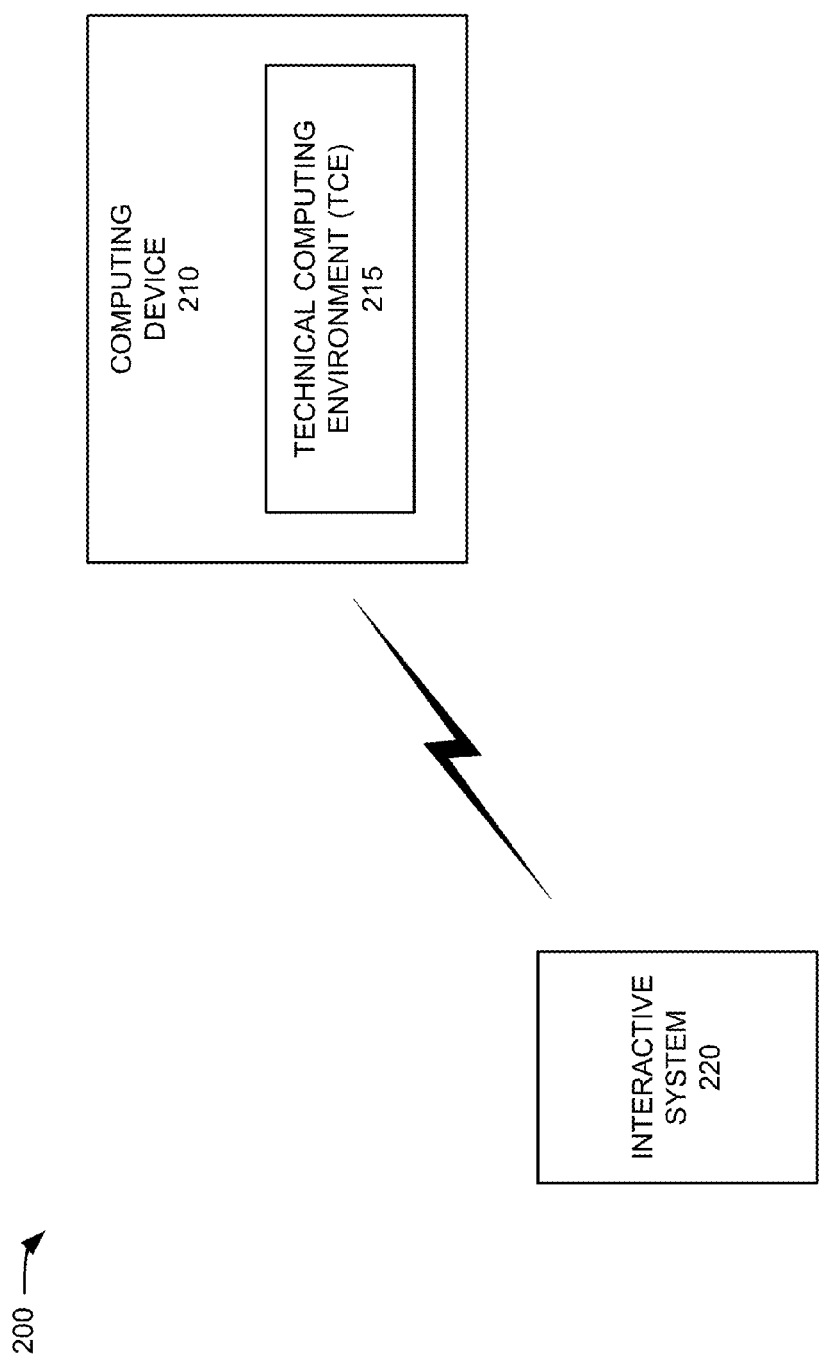

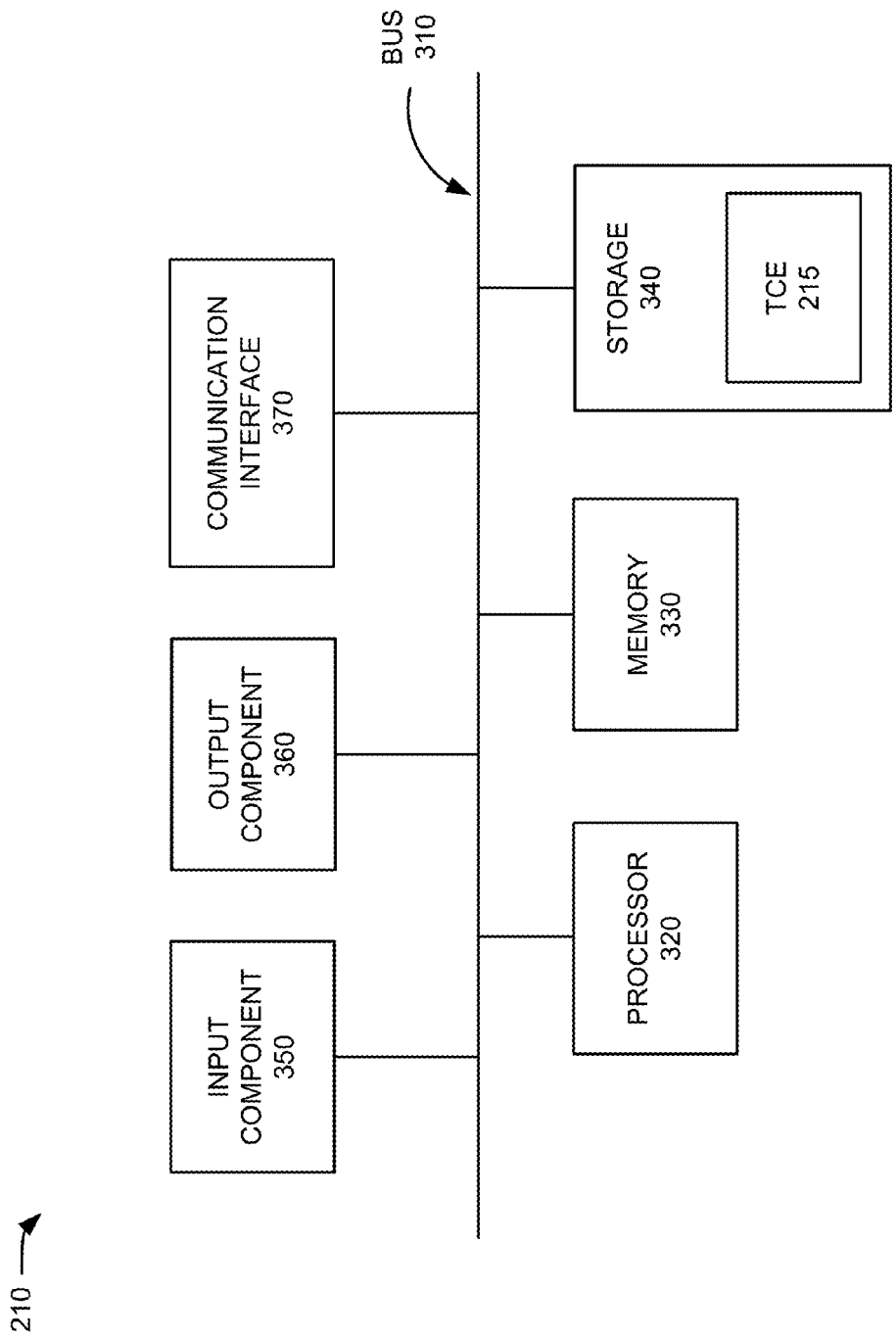

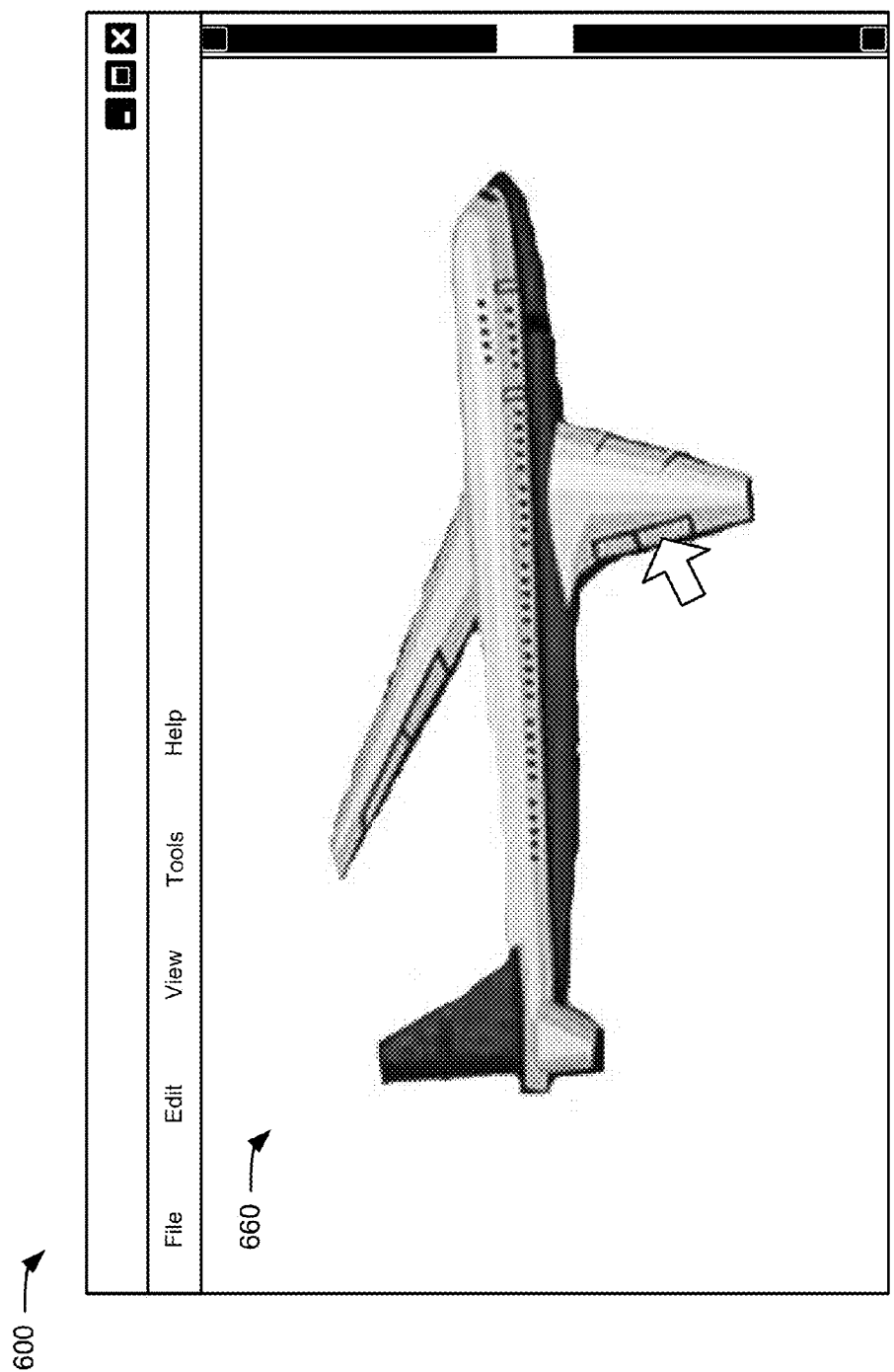

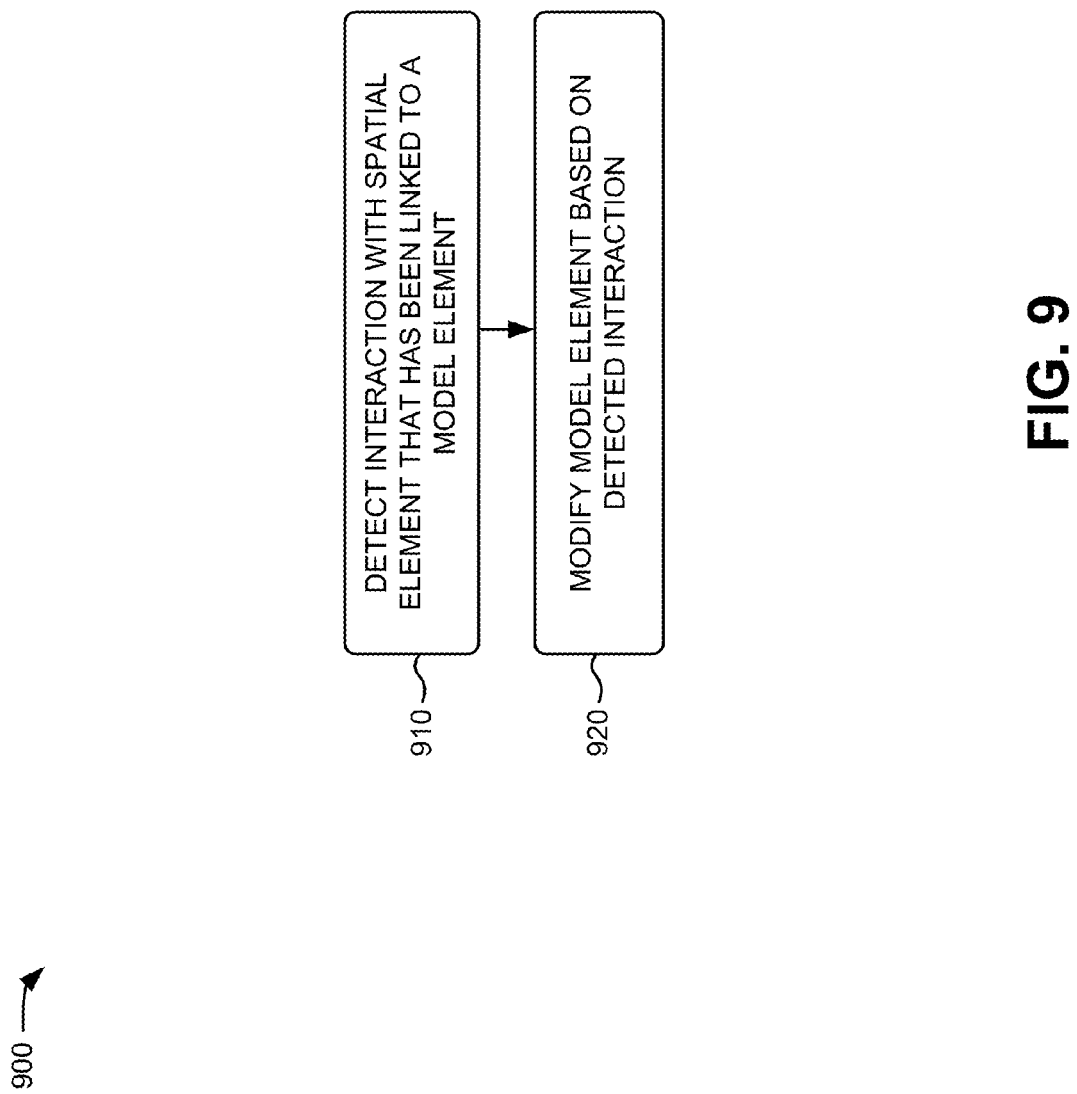

LINKING OF MODEL ELEMENTS TO SPATIAL ELEMENTS

REFERENCE TO RELATED APPLICATION

This application is a Continuation-in-Part of U.S. patent application Ser. No. 13/533,841, filed Jun. 26, 2012, the entire content of which is incorporated herein by reference.

BRIEF DESCRIPTION OF THE DRAWINGS

FIG. 2 is a diagram of an example environment in which systems and/or methods, described herein, may be implemented;

FIG. 3 is a diagram of example components of the computing device of FIG. 2;

FIGS. 6A-6E are an example of the process described in FIG. 5;

FIG. 9 is a flowchart of an example process for modifying a model element based on an interaction with a spatial element.

DETAILED DESCRIPTION

Figure 1A:
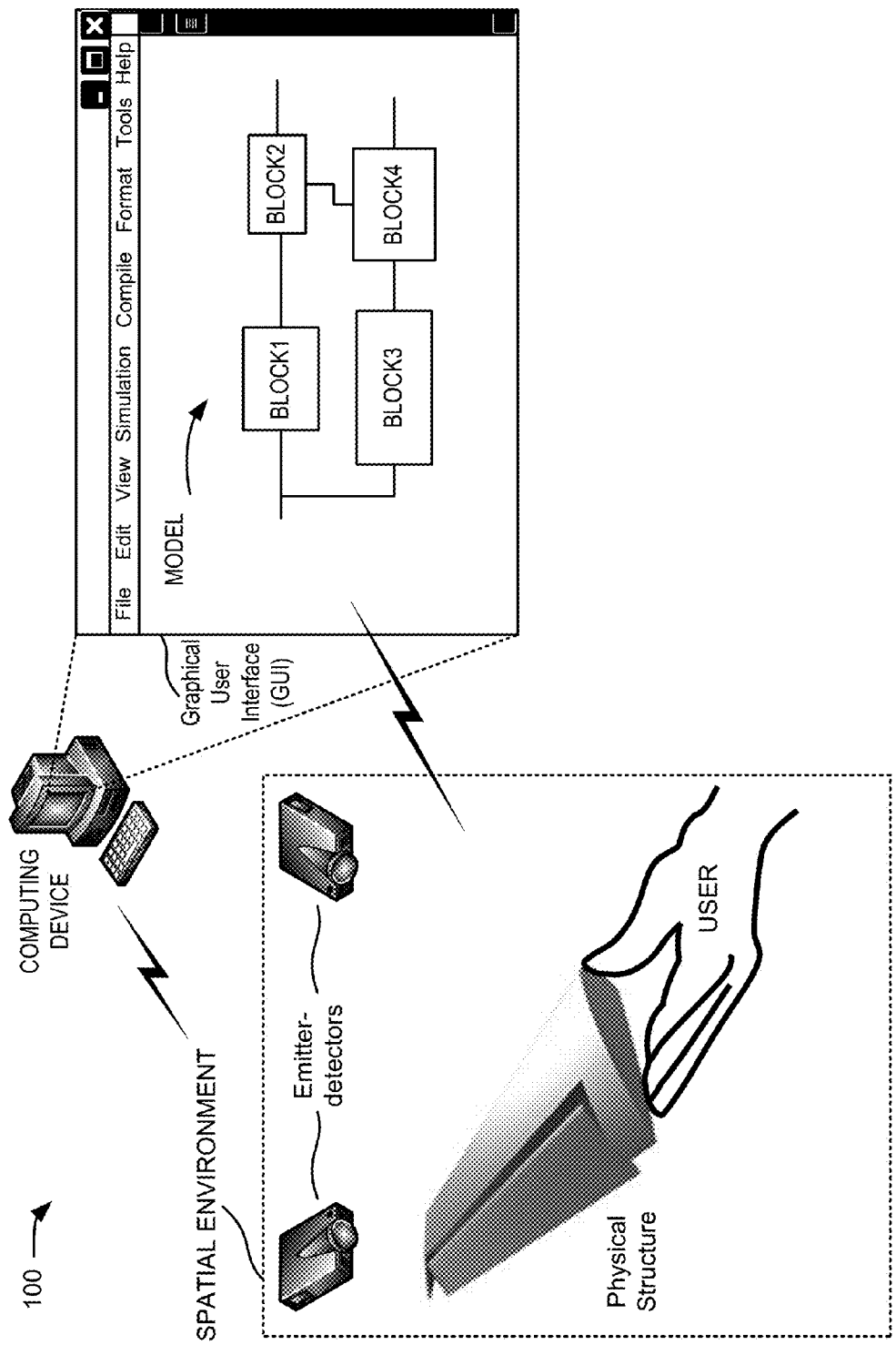
FIGS. 1A and 1B are diagrams of an example overview of an implementation described herein.

The following detailed description of example embodiments refers to the accompanying drawings. The same reference numbers in different drawings may identify the same or similar elements.

A model may include a set of model elements that, when executed on a computing device, simulates behavior of a system, such as a dynamic system (e.g., an airplane wing/aileron system); a natural system (e.g., human organ, a plant, etc.), a physical system (e.g., a bouncing ball, etc.), etc. The system may include a set of physical elements that correspond to portions and/or components of the system. The model elements may correspond to physical elements and may, when executed, simulate the behavior of the physical elements and/or the system. The description below is described in the context of a dynamic system for explanatory purposes only. Systems and/or methods, described herein, may also be applied to static systems.

Systems and/or methods, described herein, may enable a computing device to create a link between a model element, in a model, and a spatial element in a spatial environment. Once the link is created, a user may use the spatial element to control the model element. Interacting with the model, via the spatial environment, may improve a user experience when using the model to run a simulation and/or improve a manner in which the model simulates behavior of the dynamic system.

Systems and/or methods, as described herein, may use a computing environment, such as a technical computing environment (TCE), for performing computing operations. A TCE may include any hardware-based logic or a combination of hardware and software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, Simscape™ software, etc., by The MathWorks, Incorporated; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models of systems and/or processes. The TCE may include additional tools, such as tools designed to convert a model into an alternate representation, such as source computer code, compiled computer code, or a hardware description (e.g., a description of a circuit layout). This alternate representation may also include a link to a tag that is associated with the model element. The tag, thus, may enable the TCE to navigate to the model element and/or to one or more hierarchical levels of a model in which the model element exists. Additionally, or alternatively, the tag may enable the TCE to navigate to an element, in the alternative representation, that includes the link to the tag. Additionally, or alternatively, the tag may enable the TCE to navigate to one or more hierarchical levels, of the alternate representation, in which the element exists. In some implementations, the TCE may provide this ability using graphical toolboxes (e.g., toolboxes for signal processing, image processing, color manipulation, data plotting, parallel processing, etc.). In some implementations, the TCE may provide these functions as block sets. In some implementations, the TCE may provide these functions in another way.

Models generated with the TCE may be, for example, models of a physical system, a computing system, an engineered system, an embedded system, a biological system, a chemical system, etc. The models may be based on differential equations, partial differential equations, difference equations, differential and algebraic equations, discrete-event systems, state transition systems, state charts, data-flow systems, etc. In some implementations, models may be hierarchical, and include a number of hierarchical levels. A hierarchical level, of a hierarchical model, may be represented by an entity, such as a subsystem or a subchart. The subsystem or subchart may be associated with a local namespace, where data may be globally accessible within the namespace, but not outside the namespace.

A model generated with the TCE may include, for example, any equations, action language, assignments, constraints, computations, algorithms, functions, methods, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), noncausal block diagrams (e.g., via the Simscape™ product, available from The MathWorks, Incorporated), and/or any other type of model.

The values of attributes of a model generated with the TCE may be set to characteristics settings, such as one or more default settings, one or more inherited settings, etc. For example, the data type of a variable that is associated with a block may be set to a default data type, such as a double. Because of the default setting, an alternate data type (e.g., a single, an integer, a fixed point, etc.) may be inferred based on attributes of elements that the model includes (e.g., the data type of a variable associated with a connected block) and/or attributes of the graphical model. As another example, the causality of an equation (i.e., which variable in the equation is computed by using that equation) associated with a block may be inferred based on attributes of elements that the model includes (e.g., the fixed causality of source elements in the model, the preferred causality of integration over time, etc.).

As yet another example, the sample time associated with a block may be set to be inherited. In case of an inherited sample time, a specific sample time may be inferred based on attributes of elements that the graphical model includes and/or attributes of the graphical model (e.g., a fundamental execution period). This inference may be performed by propagation of model element attributes. For example, after evaluating the sample time attribute of a first block, a graph search may proceed by evaluating the sample time attribute of a second block that is directly connected to the first block. The evaluating of the sample time attribute of the second block may account for the sample time attribute value of the first block (e.g., by adopting the value of the sample time attribute of the first block). Other attributes may also be inferred, such as dimension attributes and complexity attributes (e.g., whether a variable has an imaginary part).

As previously mentioned, an example embodiment of the TCE may use one or more text-based products, such as textual modeling environments. For example, a text-based modeling environment, may be implemented using products such as, but not limited to, MATLAB by The MathWorks, Incorporated; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, computer aided design (CAD), product life cycle management (PLM), life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents®, Simscape™, etc., by The MathWorks, Incorporated; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

Figure 1B:
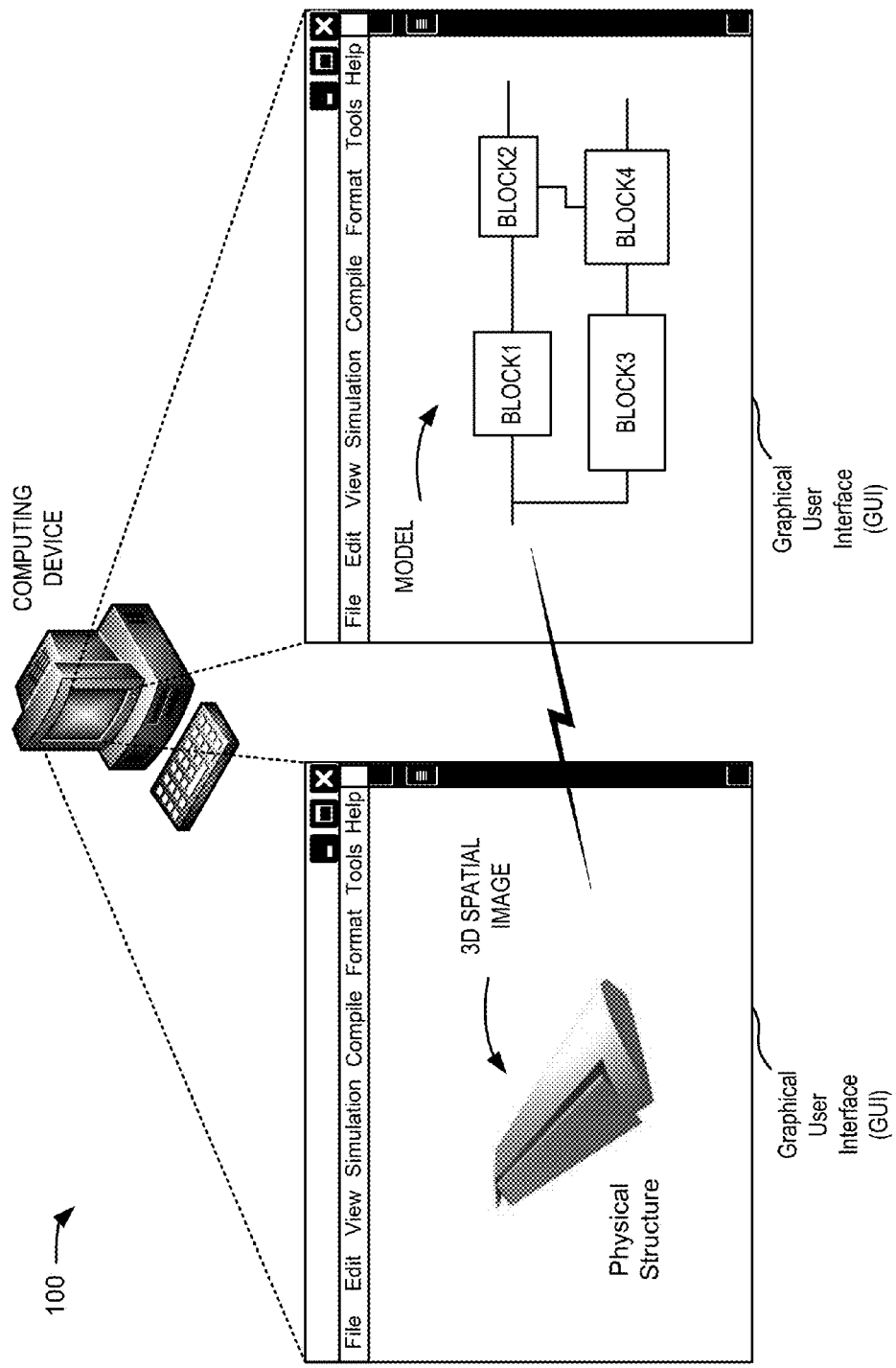

FIGS. 1A-1B are diagrams illustrating an overview 100 of an example implementation described herein. With reference to FIG. 1A, assume a user, of a computing device, has created, in a TCE and on a graphical user interface, a model that includes a number of interconnected model elements, shown as BLOCK1, BLOCK2, BLOCK3, and BLOCK4. The user may use the computing device to create a link between a model element, in the model, and a spatial element in a spatial environment. As shown in FIG. 1A, the spatial element may take the form of a physical object. As shown in FIG. 1B, the spatial element may additionally, or alternatively take the form of a graphical element depicted in a graphical user interface. In some implementations, the graphical element may be a representation of the physical object with which the model element corresponds, provided in two or more dimensions.

Once the link has been created between the model element and the spatial element, interactions in the spatial environment may affect the TCE, and interactions with the model may affect the spatial environment. For example, once the spatial element is detected in the spatial environment or on graphical user interface, the computing device may navigate the model to cause the linked model element to be displayed on the graphical user interface. As another example, interaction with the spatial element may cause the behavior of the model element to change.

FIG. 2 is a diagram of an example environment 200 in which systems and/or methods, described herein, may be implemented. As illustrated, environment 200 may include a computing device 210 and an interactive system 220.

Computing device 210 may include one or more devices capable of creating and/or executing a model. For example, computing device 210 may include a server, a workstation, a mainframe, a computer (e.g., a desktop computer, a laptop computer, a tablet computer, etc.), and/or some other type of computational device. Computing device 210 may generate, compile, and/or execute code.

Computing device 210 may host a TCE 215. TCE 215 may include hardware-based logic or a combination of hardware and software-based logic that provides a computing environment. TCE 215 may permit a user to perform tasks related to a discipline or a domain. For example, TCE 215 may pertain to mathematics, science, engineering, medicine, business, and/or another type of discipline or domain in a manner similar to that described above. In some implementations, TCE 215 may be hosted by another device, such as a server, that is located remotely from computing device 210.

Interactive system 220 may provide a spatial environment capable of communicating with computing device 210. Interactive system 220 may, for example, include one or more cameras, video cameras, infrared cameras, sonar, radar, depth sensors, microphones, multi-array microphones, lasers, photo detectors, radio frequency (RF) transmitters and/or receivers, electromagnetic field detectors, etc. Interactive system 220 may provide the spatial environment by monitoring a 3D volume of space. Interactive system 220 may, based on monitoring the 3D volume of space, obtain information (e.g., images, video, audio, RF signatures, optical signatures, electromagnetic field signatures, etc.) associated with a physical object that is detected within the spatial environment.

Although FIG. 2 shows example components of environment 200, in some implementations, environment 200 may include additional components, fewer components, different components, or differently arranged components than those depicted in FIG. 2. Additionally, or alternatively, one or more components of environment 200 may perform one or more tasks described as being performed by one or more other components of environment 200.

FIG. 3 is a diagram of example components of computing device 210. As shown in FIG. 3, computing device 210 may include a bus 310, a processor 320, a memory 330, storage 340, an input component 350, an output component 360, and/or a communication interface 370.

Bus 310 may permit communication among the other components of computing device 210. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphics processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of computing device 210. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of computing device 210. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from computing device 210, such as a Universal Serial Bus (USB) memory stick, a hard disk, etc. In an implementation, as illustrated, storage 340 may store TCE 215.

Input component 350 may permit the user and/or another device to input information into computing device 210. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit computing device 210 to output information to the user and/or another device. For example, output component 360 may include a display, a speaker, a light emitting diode (LED), a haptic device, a tactile device, an output port, and/or some other type of output component.

Communication interface 370 may permit computing device 210 to communicate with other devices and/or systems via one or more networks. Communication interface 370 may include a transceiver-like component. For example, communication interface 370 may include an Ethernet interface, an optical interface, a coaxial interface, a radio interface, and/or some other type of wireless and/or wired interface.

As will be described in detail below, computing device 210 may perform certain operations relating to implementations described herein. Computing device 210 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of computing device 210, in some implementations, computing device 210 may include additional components, fewer components, different components, or differently arranged components than those depicted in FIG. 3. Additionally, or alternatively, one or more components of computing device 210 may perform one or more tasks described as being performed by one or more other components of computing device 210.

Figure 4:
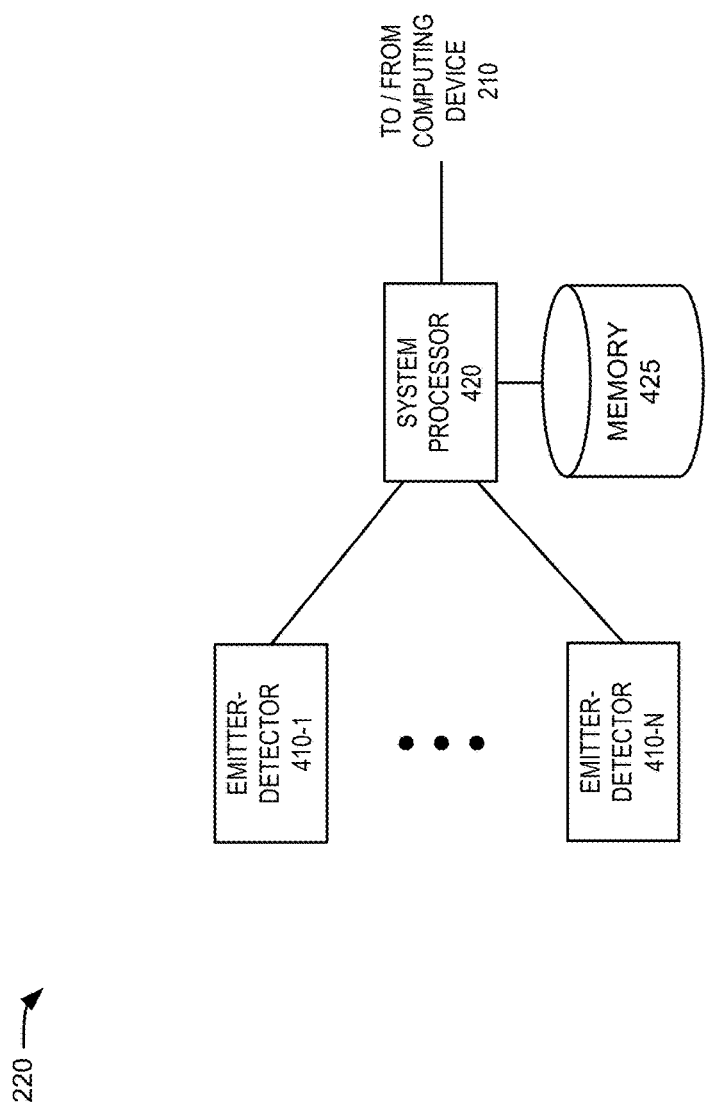
FIG. 4 is a diagram of example components of the interactive system of FIG. 2.

FIG. 4 is a diagram of example components of interactive system 220. As shown, interactive system 220 may include a group of emitter-detectors 410-1, . . . , 410-N (where N≥1) (hereinafter referred to collectively as "emitter-detectors 410" and individually as "emitter-detector 410"), a system processor 420, and a memory 425.

Emitter-detector 410 may include one or more devices that obtain information associated with a physical object located within and/or interacting with a 3D volume of space that corresponds to a spatial environment. For example, emitter-detector 410 may include a camera, a RF transmitter, a RF receiver, a speaker, a microphone, a multi-array microphone, a laser, a sonar, a radar, an infrared camera, a depth sensor, a photo detector, a magnetic and/or electromagnetic component, etc. Emitter-detector 410 may, for example, include a camera to record images and/or video (e.g., based on frequencies that correspond to visible light, infrared, ultraviolet, etc.) of a physical object (e.g., a pen, pencil, book, a user device, such as a cellular phone, all or a portion of a user (e.g., the user's hands, fingers, head, eyes, body, etc.), etc.) within the spatial environment. Emitter-detector 410 may provide the video to system processor 420 to be processed. Additionally, or alternatively, emitter-detector 410 may include a transmitter that transmits a signal (e.g., a RF transmitter to transmit a RF signal, a speaker to transmit an acoustic signal, etc.) into the spatial environment. Emitter-detector 410 may include a receiver (e.g., a RF receiver, a microphone, etc.) to receive a signal that reflects off the physical object located within the spatial environment (e.g., a RF receiver to receive a reflected RF signal, a microphone to receive a reflected acoustic signal, etc.). The received signal may identify dimensions, surface contours, location, orientation, etc. of the physical object within the spatial environment. Emitter-detector 410 may convert the received signal to an electrical signal and/or a format that can be processed by system processor 420. Emitter-detector 410 may also, or alternatively, receive a signal from a physical object, within the spatial environment, that corresponds to a user device. In this example, the received signal may identify a location and/or an orientation, associated with the user device, within the spatial environment.

Emitter-detector 410 may also, or alternatively, include a laser that transmits an optical signal that scans the spatial environment. Emitter-detector 410 may also, or alternatively, include a photodiode and/or some other component that receives a reflected optical signal from the physical object that is located within the spatial environment. The reflected signal may identify dimensions, surface contours, location, orientation, etc. associated with the physical object within the spatial environment. Emitter-detector 410 may convert the reflected optical signal to an electrical signal and/or to a format that can be received and/or processed by system processor 420.

In some implementations, emitter-detector 410 may be implemented as two or more separate devices. In one example, emitter functions (e.g., that enable information and/or signals to be transmitted to the spatial environment) may be implemented in a separate device from detector functions (e.g., that receive transmitted and/or reflected information and/or signals from the spatial environment). For example, a first emitter-detector 410, that performs emitter functions, may transmit a signal (e.g., a RF signal, an acoustic signal, an optical signal, etc.) into the spatial environment and a second emitter-detector 410, that performs detector functions, may receive the transmitted signal and/or a reflected signal that reflects off of the physical object located within the spatial environment. The first emitter-detector 410 and the second emitter-detector 410 may be mono-static with respect to the spatial environment (e.g., associated with approximately the same viewing angle with respect to the spatial environment) or may be bi-static or multi-static with respect to the spatial environment (e.g., associated with different viewing angles with respect to the spatial environment).

System processor 420 may include one or more processors that interpret and/or execute instructions. For example, system processor 420 may include a general-purpose processor, a microprocessor, a data processor, a GPU, a processing core, an ASIC, an ASIP, a SOC, a PLD, a chipset, a FPGA, and/or another type of processor. System processor 420 may receive, from emitter-detector 410, video content and/or signals that include information associated with the physical object located within the spatial environment. System processor 420 may also, or alternatively, process the received information to create spatial information associated with the physical object. In one example, system processor 420 may receive information from two or more emitter-detectors 410 that obtain information, associated with the spatial environment, from two or more viewing angles. System processor 420 may use the information, obtained from the two or more viewing angles, to perform stereoscopic and/or holographic processing on received information to generate spatial information, associated with the physical object, based on three-spatial dimensions. In one example, the spatial information may represent a signature (e.g., a visual signature, an infrared signature, a RF signature, an acoustic signature, etc.) of the physical object (e.g., in two dimensions, three-dimensions, etc.).

System processor 420 may, for example, process the received information to identify the physical object based on dimensions (e.g., length, width, height, etc.), surface contours (e.g., boundaries, edges, curvatures, etc.), color, brightness, etc. associated with the physical object. System processor 420 may also, or alternatively, process the information to identify a location and/or an orientation, associated with the physical object, based on a three-dimensional coordinate system associated with the spatial environment. The location may be based on a coordinate system, associated with the spatial environment, such as, a Cartesian coordinate system (e.g., based on orthogonal x-axis, y-axis, z-axis), a cylindrical coordinate system (e.g., based on radial distance, height distance, and angular component), a spherical coordinate system (e.g., based on radial distance, azimuth angle, and polar angle), etc. The orientation may also, or alternatively, be represented by an amount of roll, pitch, and/or yaw of the physical object within the spatial environment. System processor 420 may also use the received information to identify particular gestures (e.g., hand gestures, etc.) and/or movements by a user and/or the physical object that represent instructions (e.g., select a spatial element, select a model element, execute a model, change an orientation, change an attribute associated with a model, change a value of an attribute associated with a model, etc.) to be interpreted by computing device 210. System processor 420 may also use the received information to determine a change in location and/or orientation, of the user and/or the physical object, as a function of time. System processor 420 may provide the processed information, as spatial information, to computing device 210.

Memory 425 may include one or more memory devices that store data and/or instructions related to the operation and use of interactive system 220. For example, memory 425 include a RAM, a DRAM, a SRAM, a SDRAM, a FRAM, a ROM, a PROM, an EPROM, an electrically erasable programmable read only memory EEPROM, a flash memory, and/or another type of memory. Memory 425 may also, or alternatively, store spatial information obtained and/or generated based on monitoring the spatial environment.

Although FIG. 4 shows example components of interactive system 220, in some implementations, interactive system 220 may include additional components, fewer components, different components, or differently arranged components than those depicted in FIG. 4. Additionally, or alternatively, one or more components of interactive system 220 may perform one or more tasks described as being performed by one or more other components of interactive system 220.

Figure 5:
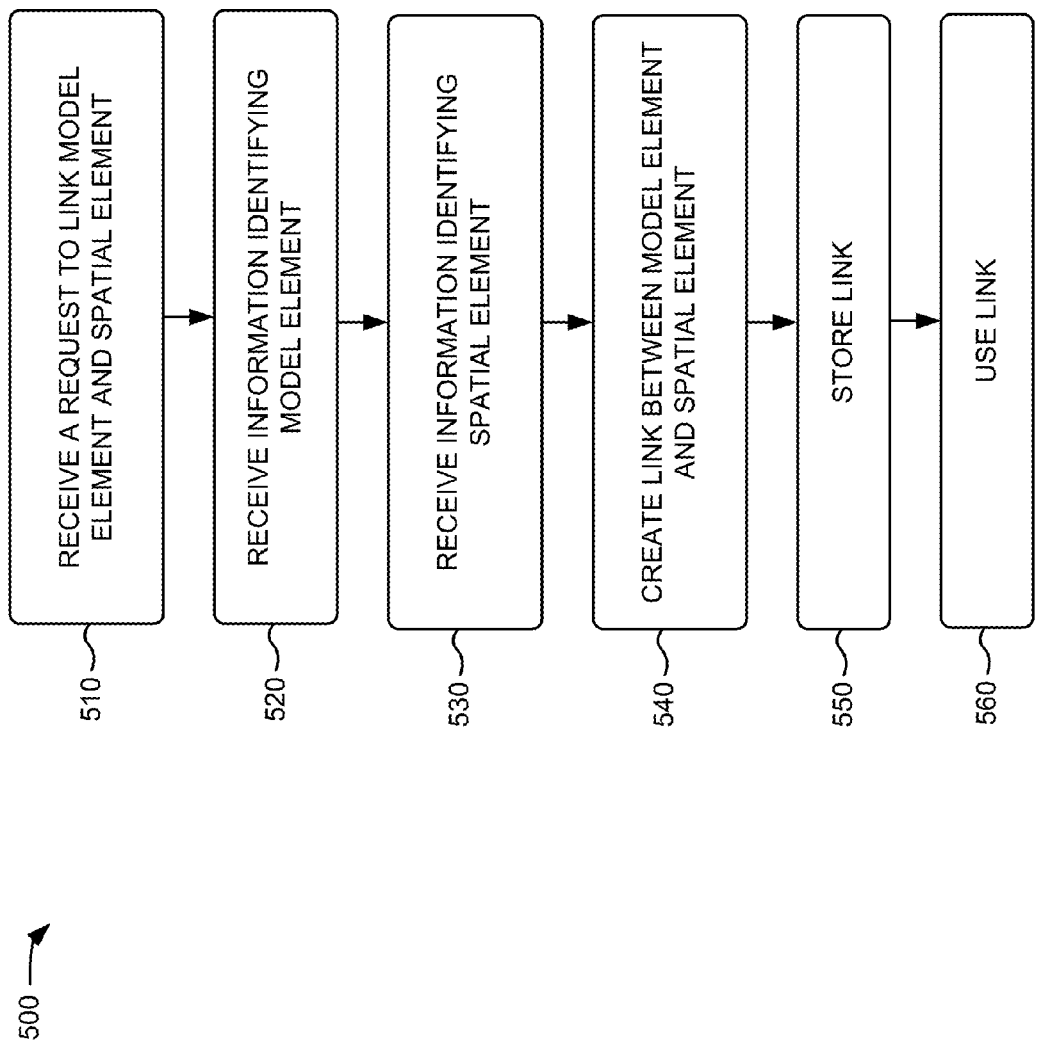
FIG. 5 is a flowchart of an example process for creating a link between a model element and a spatial element.

FIG. 5 is a flowchart of an example process 500 for creating a link between a model element and a spatial element. In some implementations, process 500 may be performed by computing device 210. In some implementations, one or more blocks of process 500 may be performed by one or more devices instead of, or possibly in conjunction with, computing device 210.

While the following description focuses on the linking of a model element to a spatial element, systems and methods, as described herein, are applicable to linking a single model element to a single spatial element, a single model element to more than one spatial element, more than one model element to a single spatial element, and more than one model element to more than one spatial element.

Process 500 may include receiving a request to link a model element and a spatial element (block 510). For example, computing device 210 (e.g., TCE 215) may receive a request, from a user of computing device 210, to link a model element with a spatial element. In some implementations, computing device 210 may receive the request based on detecting a selection of a particular menu item, entry of a particular textual or audible input from the user, and/or entry of some other predetermined input that identifies a desire to link a model element and a spatial element.

Process 500 may include receiving information identifying a model element (block 520). For example, computing device 210 (e.g., TCE 215) may provide a user interface, to the user, that allows the user to specify a model element, of a model, that will be linked to a spatial element. In some implementations, the user interface may be provided as a separate window, such as a popup window. In some implementations, the user may provide information, to the user interface, identifying the model element, such as a name of the model element. In some implementations, the user may specify the model element based on the user selecting the model element in TCE 215 (e.g., by clicking on the model element). In these implementations, the user interface may automatically be populated with information identifying the model element that was selected in TCE 215. The user may identify the model element in other ways, including ways that do not include a user interface.

Process 500 may include receiving information identifying a spatial element (block 530). For example, computing device 210 (e.g., TCE 215) may provide a user interface, to the user, that allows the user to specify a spatial element that will be linked to the identified model element. In some implementations, the user interface may be provided as a separate window, such as a popup window. In some implementations, the user interface may allow the user to specify a manner in which the spatial element will be identified. For example, computing device 210 may allow the user to identify the spatial element via interactive system 220, via a graphical user interface, or in another manner.

With respect to interactive system 220, the user may provide a physical object into the spatial environment monitored by interactive system 220. In some implementations, the physical object may resemble the physical structure to which the identified model element corresponds. For example, if the identified model element corresponds to an aileron, the physical object may resemble an aileron. In some implementations, the physical object may not resemble the physical structure to which the identified model element corresponds. For example, assuming again that the identified model element corresponds to an aileron, the physical object may be a pen, a pencil, a cellular phone, a book, a part of the human body (e.g., the user's torso, hand, arm, head, etc.), or another three dimensional physical object. Interactive system 220 may detect the presence of the physical object in the spatial environment and may provide information identifying the physical object to computing device 210. The information may include textual information, descriptive information, and/or visual information relating to the physical object. Computing device 210 may cause some or all of the received information to populate the user interface.

In some implementations, the physical object may correspond to a portion of a physical structure located within the spatial environment. In these implementations, interactive system 220 may detect the physical object based on the user identifying the physical object within the spatial environment (e.g., by pointing to the physical object). As an example, assume that the user intends to have the user's hand linked to the model element. In this example, the user may step within the spatial environment being monitored by interactive system 220 and point to the hand that the user desires to have linked to the model element. Interactive system 220 may detect that the hand is intended to be the spatial element based on the pointing gesture.

In some implementations, interactive system 220 may provide a virtual representation of a physical object in the spatial environment. For example, interactive system 220 may provide a stereoscopic, holographic, etc., representation of a physical object in the spatial environment. The user may identify the representation or a portion of the representation as the spatial element.

With respect to the graphical user interface, the user may provide a graphical object in a graphical environment being provided by the graphical user interface. The graphical user interface may be provided by computing device 210 or another device. The graphical user interface may be a Computer-Aided Design (CAD) environment or another type of environment that allows graphical objects to be displayed in two or more dimensions. Computing device 210 may be capable of detecting user interactions with the graphical user interface and transmit information, relating to the interactions, to TCE 215. The graphical object may graphically correspond to a physical structure to which the identified model element corresponds. For example, if the identified model element corresponds to an aileron, the graphical object may resemble an aileron and be presented, in the graphical user interface, in two or more dimensions. In some implementations, the graphical object may not resemble the physical structure to which the identified model element corresponds. In any event, the user may select the graphical object, within the graphical user interface, to which the model element is to be linked. Based on the selection, computing device 210 may cause information, relating to the graphical object, to populate the user interface.

As an alternative to identifying the spatial element using interactive system 220 or a graphical user interface, the user may upload an image of the spatial element. For example, assume that the user desires to link the model element to the user's cellular phone. The user may upload an image of the user's cellular phone to computing device 210. Computing device 210 may populate the user information with information relating to the image. Other ways of identifying the spatial element may alternatively be used.

Process 500 may include creating a link between the model element and the spatial element (block 540). For example, computing device 210 (e.g., TCE 215) may use the information identifying the model element and the information identifying the spatial element to create a link between the model element and the spatial element. In some implementations, the link may take the form of a selectable link, such as a Uniform Resource Locator (URL). In some implementations, the link may be represented in other ways. For example, computing device 210 may store information, in a data structure, identifying the link between the model element and the spatial element. Details relating to the use of the link are provided below with respect to FIG. 7.

Process 500 may include storing the link (block 550). For example, computing device 210 (e.g., TCE 215) may store information, in a data structure, identifying the link between the model element and the spatial element. In an implementation in which the link takes the form of a selectable link, computing device 210 may cause the selectable link to be displayed in association with the model element. Additionally, or alternatively, in an implementation where the spatial element corresponds to a graphical object, in a graphical environment, computing device 210 may cause the selectable link to be displayed in association with the graphical object. For example, computing device 210 may cause the selectable link to be displayed next to the graphical object in a textual form, a graphical form, as a thumbnail image, etc.

In some implementations, computing device 210 may store information in connection with the link that relates to the spatial element and/or the model element. For example, the link may contain or be associated with information that indicates a manner in which the spatial element should be displayed, such as a viewing angle, a scale, coloring, transparency, etc. In some implementations, the link may contain or be associated with information that indicates a manner in which the model element should be modified, such as a manner in which a parameter of the model element should change.

Process 500 may include using the link (block 560). For example, once the link has been created, the user may use the link in a number of different ways. In some implementations, the user may export the link in a file, for example, to potentially be imported for use in another model. In some implementations, the user may include the link in automatically generated code that, for example, corresponds to the model element. In some implementations, the user may include the link in a report. Thus, in these implementations, selection of the link, in the report, may cause TCE 215 to navigate to the model element and, when the spatial element corresponds to a graphical object, cause the graphical object to be rendered for display in a graphical user interface or as a virtual representation of a physical object in the spatial environment. In some implementations, the user may include the link in a requirements repository. In these implementations, the link may include or be associated with requirements that are linked to a model element. In some implementations, the user may import the link for use in a model, for example, from a file, a repository, etc., and the link may be associated with a corresponding model element (e.g., based on a static identification, a model element name, a model element location in the model, etc.).

In some implementations, the user may forward the link to another user. For example, the user may email the link to another user. When the other user selects the link in the email, a computing device, associated with the other user, may automatically cause the model element to be displayed. Additionally, or alternatively, selection of the link may cause the computing device to cause the spatial element to be displayed in a graphical user interface and/or in the spatial environment. The computing device may retrieve the model element and/or the information for displaying the spatial element from a local or networked storage location. In some implementations, the user may perform a copy and paste function in relation to the link to create a new link between the spatial element and a new model element (in the same model or a different model) or between the model element and a new spatial element.

In some implementations, the user may bookmark the link. For example, the user may cause computing device 210 to store a list of favorite links at a local or networked storage location. In some implementations, computing device 210 may store a list of most-recently activated links at a local or networked storage location. In either event, the user may store links and later activate, export, forward, modify, reuse in a different model, etc. the links.

In some implementations, a user may search for model elements or model attributes that are associated with links. For example, a user may enter a search string and computing device 210 may return a set of search results (e.g., a list) that may be based on, for example, how close the search string matches the name of a model element or attribute, the type of a model element or attribute, the name of a linked spatial element, the name of the link, etc. In some implementations, the matching may be based on regular expressions (e.g., wildcards, pattern matching, etc.). In some implementations, the set of search results may include links that may be selected by the user to navigate to the linked model element, model attribute, spatial element, etc.

While FIG. 5 shows process 500 as including a particular quantity and arrangement of blocks, in some implementations, process 500 may include fewer blocks, additional blocks, or a different arrangement of blocks. Additionally, or alternatively, some of the blocks may be performed in parallel.

FIGS. 6A-6E are an example 600 of process 500 described above with respect to FIG. 5. As shown in relation to FIG. 6A, computing device 210 may provide a TCE that includes a model 610. As shown, model 610 may include a group of blocks, identified as BLOCK1, BLOCK2, BLOCK3, BLOCK4, BLOCK5, BLOCK6, and BLOCK7. For example 600, assume that model 610 corresponds to a portion of an airplane and that BLOCK3 corresponds to an aileron. Assume further that the user is interested in linking BLOCK3 to a spatial element. The user may right click on BLOCK3 to cause a popup menu 620 to be displayed. Popup menu 620 may allow the user to create a link or break (i.e., terminate) a created link. Assume that the user selects the CREATE LINK menu item.

Figure 6A:
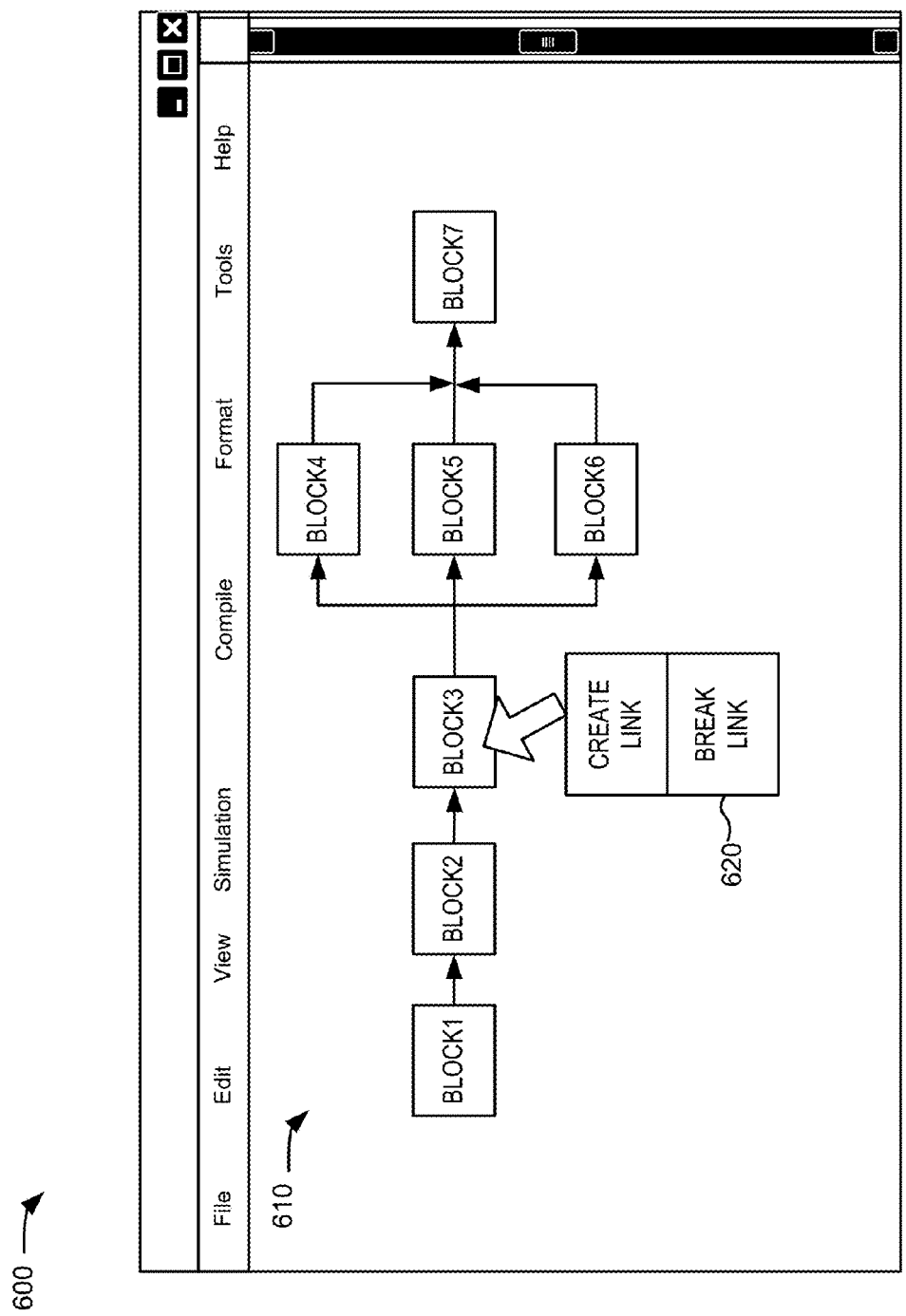
Figure 6B:
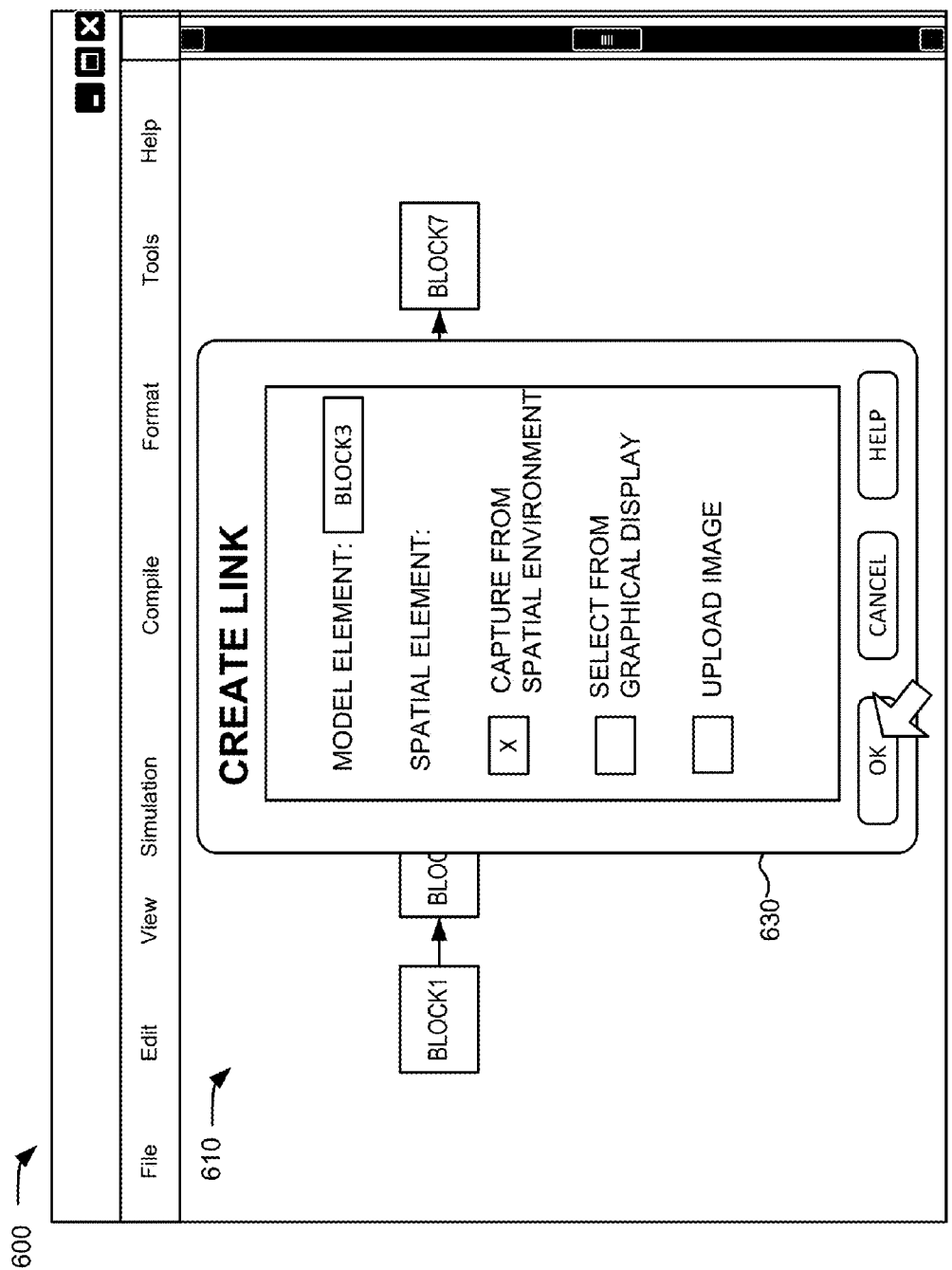

Upon detecting the selection of the CREATE LINK menu item, computing device 210 may provide a user interface 630, as shown in FIG. 6B. User interface 630 may allow the user to identify the model element and the spatial element. With respect to the model element and based on the user selecting BLOCK3 to initiate the link creation process, user interface 630 may be pre-populated with information identifying the model element (i.e., BLOCK3). With respect to the spatial element and as shown in FIG. 6B, user interface 630 may allow the user to specify a manner by which the spatial element will be identified. For example, user interface 630 may allow the user to obtain the information for identifying the spatial element from a spatial environment, from a graphical display environment, or from an image. Assume, for example 600, that the user has elected to provide the information identifying the spatial element from the spatial environment.

Figure 6C:
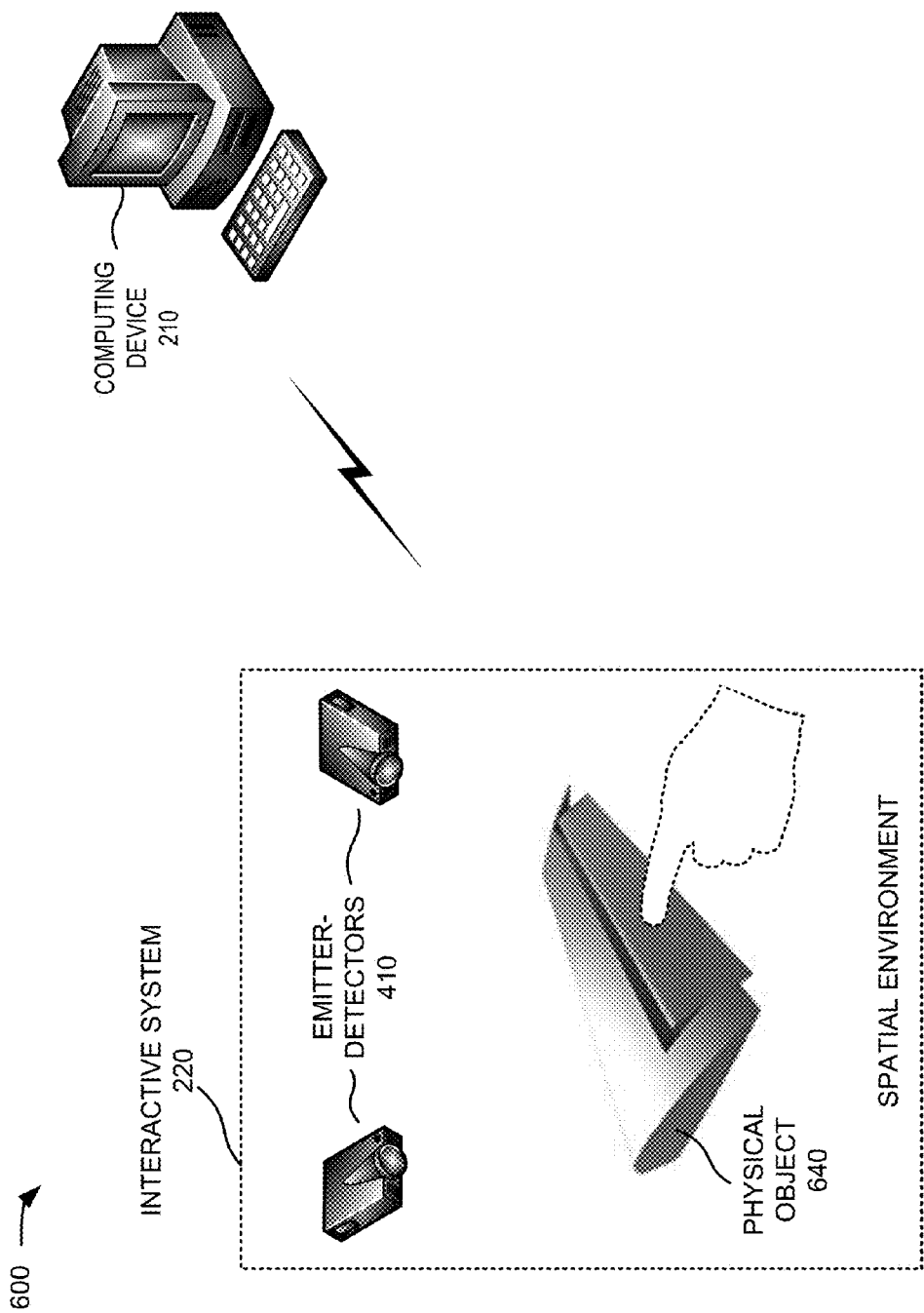

Upon selecting the OK button in user interface 630, computing device 210 may instruct the user to bring the spatial element into the spatial environment being monitored by interactive system 220. With reference to FIG. 6C, assume that the user brings a physical object 640, which resembles a wing of an airplane, into the spatial environment. Assume further that the user points to the portion of physical object 640 that corresponds to the aileron. Emitter-detectors 410 may detect the presence of physical object 640 and the user's identification of the portion of physical object 640. Emitter-detectors 410 may obtain information relating to the portion of physical object 640, such as an image of the portion of physical object 640. Emitter-detectors 410 may obtain additional or other information relating to physical object 640 and/or the portion of physical object 640, as described above with respect to FIG. 4. Interactive system 220 may transmit the obtained information to computing device 210.

Figure 6D:
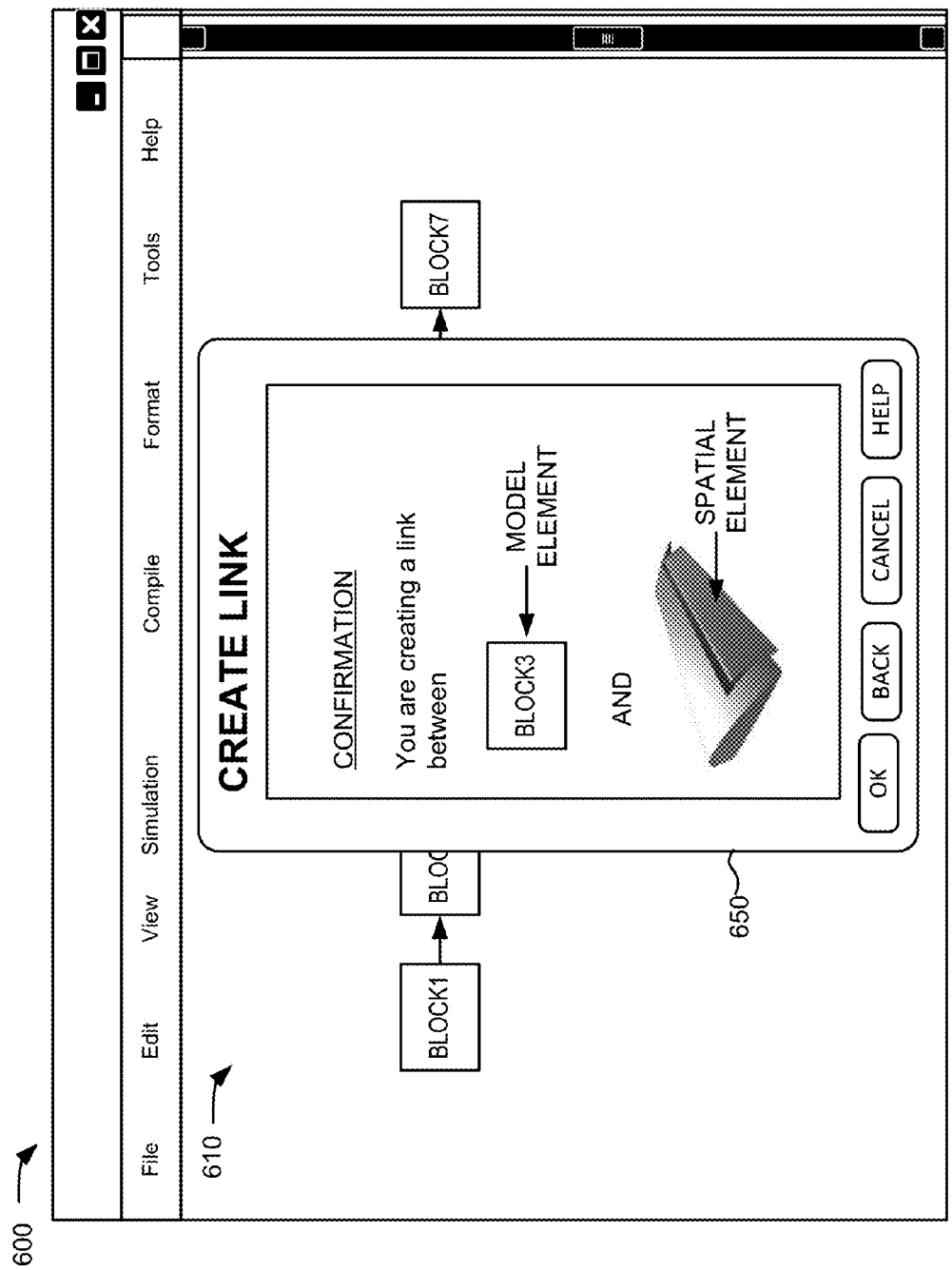

With reference to FIG. 6D, computing device 210 may cause a user interface 650 to be provided to the user. User interface 650 may provide information confirming that the link should be created between the identified model element and the identified spatial element. As shown, user interface 650 may, for example, provide an image of the model element and the spatial element. Upon selection of the OK button, computing device 210 may create the link between the identified model element and the identified spatial element.

Returning to FIG. 6B, assume that the user has elected to provide the information identifying the spatial element from a graphical display. Moreover, assume that the user has caused a graphical object to be displayed in a graphical user interface. For example 600 and with reference to FIG. 6E, assume that the user has caused computing device 210 to display a graphical object 660 (shown as an airplane) in a graphical user interface. Upon selecting the OK button in user interface 630, computing device 210 may instruct the user to select the spatial element in the graphical user interface. As shown in FIG. 6E, the user may select the aileron of graphical object 660. In response to selection of the aileron, computing device 210 may confirm that the link should be created between the identified model element and the identified spatial element, as set forth above with respect to FIG. 6D.

In some implementations, a link that is created may be assigned an identifier (e.g., by the user or automatically by TCE 215) such as, for example, a name, a numerical ID, a label, etc.

Figure 7:
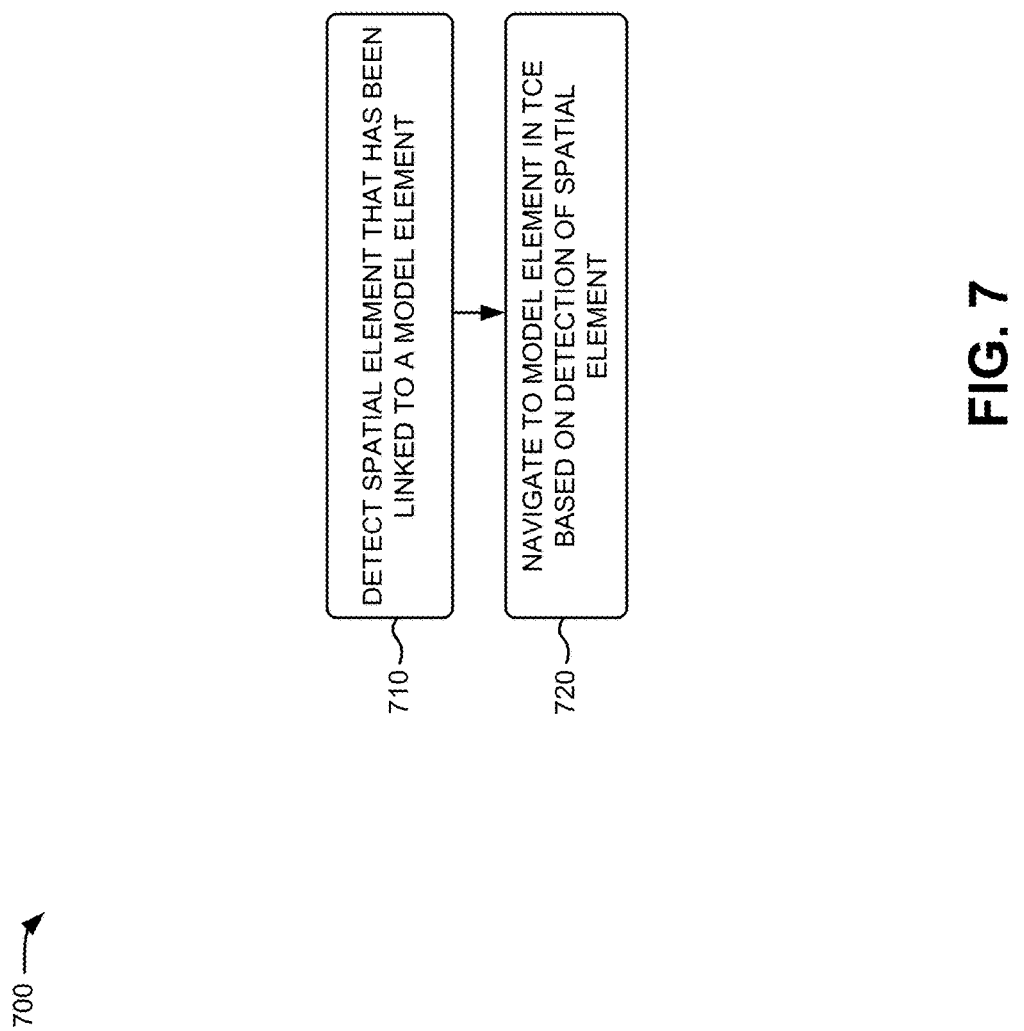
FIG. 7 is a flowchart of an example process for navigating a model based on a link between a model element and a spatial element.

FIG. 7 is a flowchart of an example process 700 for navigating a model based on a link between a model element and a spatial element. In some implementations, process 700 may be performed by computing device 210. In some implementations, one or more blocks of process 700 may be performed by one or more devices instead of, or possibly in conjunction with, computing device 210.

Process 700 may include detecting a spatial element that has been linked to a model element (block 710). For example, a user may provide the spatial element to the spatial environment being monitored by interactive system 220. Emitter-detectors 410, of interactive system 220, may detect the spatial element based on detecting the presence of the spatial element in the spatial environment. In some implementations, interactive system 220 may detect the spatial element in response to detecting that the user's eyes are fixed on the spatial element in the spatial environment. In some implementations, interactive system 220 may detect the spatial element in response to detecting that the user has selected the spatial element in the spatial environment (e.g., by pointing to the spatial element). In some implementations, interactive system 220 may detect the spatial element in response to the user verbally identifying the spatial element in the spatial environment. Interactive system 220 may detect the spatial element in the spatial environment in other ways. In any event, interactive system 220 may transmit information relating to the detection of the spatial element to computing device 210 (e.g., to TCE 215).

As another example, the user may cause the spatial element to be displayed on the graphical user interface. The user may cause the spatial element to be displayed in the graphical user interface by opening a file that includes the spatial element or by navigating to the spatial element in the graphical user interface. Computing device 210 may detect the spatial element based on the spatial element being displayed in the graphical user interface. In those implementations where the link between the spatial element and the model element is displayed in the graphical user interface, computing device 210 may detect the spatial element in response to selection of the link. In some implementations, computing device 210 may detect the spatial element in response to detecting that the user's eyes are fixed on the spatial element in the graphical user interface. In some implementations, computing device 210 may detect the spatial element in response to detecting that the user has selected the spatial element in the graphical user interface (e.g., by clicking on the spatial element or hovering a cursor over the spatial element in the graphical user interface). In some implementations, computing device 210 may detect the spatial element in response to the user verbally identifying the spatial element. Computing device 210 may detect the spatial element in the graphical user interface in other ways. In any event, computing device 210 may detect the presence of the spatial element in the graphical user interface and may provide information relating to the detection of the spatial element to TCE 215.

Process 700 may include navigating to the model element in the TCE based on detection of the spatial element (block 720). For example, computing device 210 (e.g., TCE 215) may receive the information indicating that the spatial element has been detected in the spatial environment or on the graphical user interface, or that the link has been selected in the graphical user interface. Computing device 210 may cause TCE 215 to navigate to that portion of the model that includes the model element. In this way, detection of the spatial element in the spatial environment or the graphical user interface may cause the linked model element to be displayed in TCE 215.

While FIG. 7 shows process 700 as including a particular quantity and arrangement of blocks, in some implementations, process 700 may include additional blocks or a different arrangement of blocks.

Figure 8:
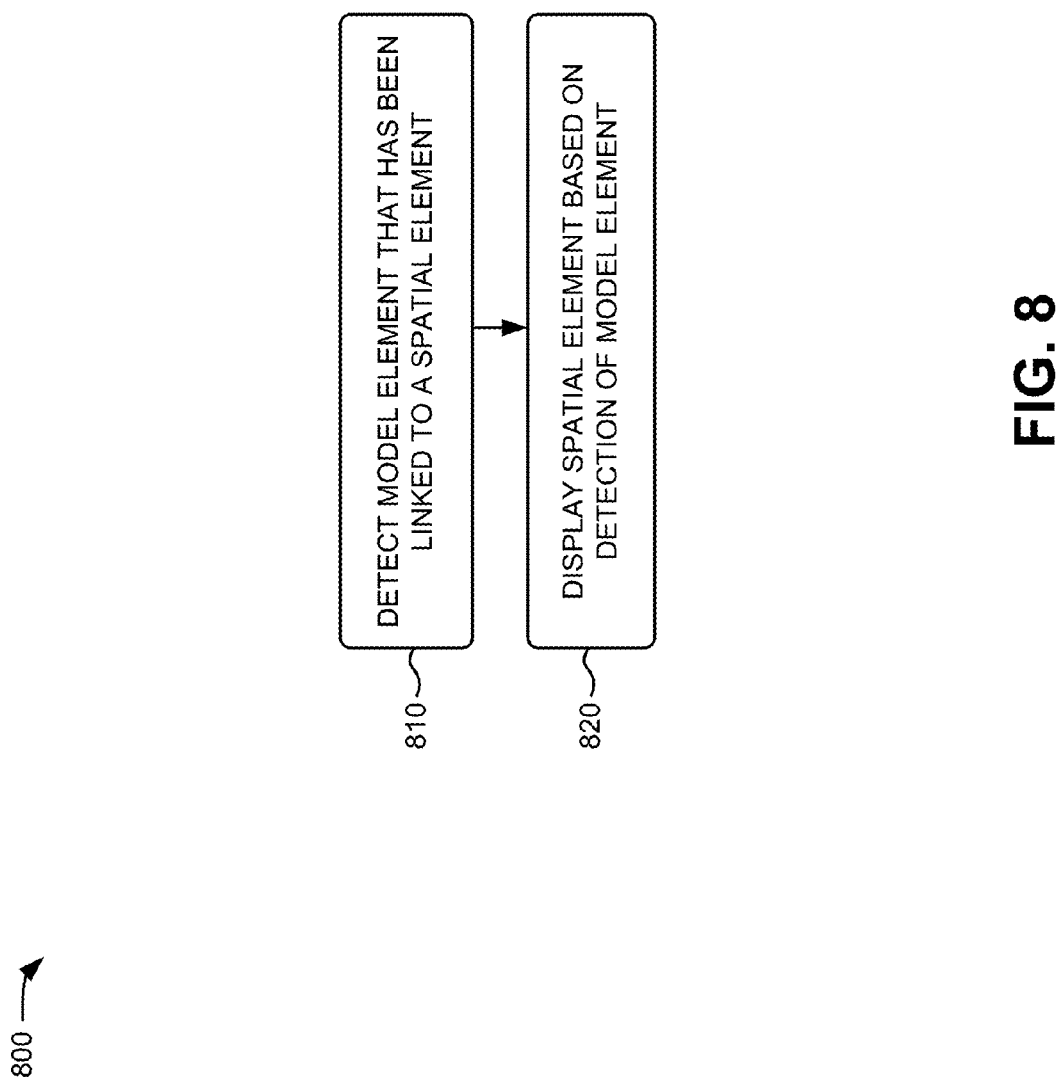
FIG. 8 is a flowchart of an example process for navigating to a spatial element based on a link between the spatial element and a model element.

FIG. 8 is a flowchart of an example process 800 for navigating to a spatial element based on a link between the spatial element and a model element. In some implementations, process 800 may be performed by computing device 210. In some implementations, one or more blocks of process 800 may be performed by one or more devices instead of, or possibly in conjunction with, computing device 210.

Process 800 may include detecting a model element that has been linked to a spatial element (block 810). For example, computing device 210 (e.g., TCE 215) may receive a model that includes the model element. Computing device 210 may detect that the user has navigated to a portion of the model that includes the model element. Computing device 210 may detect the model element based on the model element being displayed in TCE 215. In those implementations where the link between the spatial element and the model element is displayed in TCE 215, computing device 210 may detect the model element in response to selection of the link. In some implementations, computing device 210 may detect the model element in response to detecting that the user's eyes are fixed on the model element in TCE 215. In some implementations, computing device 210 may detect the model element in response to detecting that the user has selected the model element in the TCE 215 (e.g., by clicking on or hovering a cursor over the model element). In some implementations, computing device 210 may detect the model element in response to the user verbally identifying the model element in TCE 215. Computing device 210 may detect the model element in TCE 215 in other ways.

Process 800 may include displaying the spatial element based on detection of the model element (block 820). For example, computing device 210 may cause a graphical user interface to display the spatial element. In some implementations, computing device 210 may cause the graphical user interface to open a file that includes the spatial element and cause the graphical user interface to navigate to the spatial element.

In some implementations, computing device 210 may cause interactive system 220 to display the spatial element. For example, computing device 210 may send a command, to interactive system 220, to cause interactive system 220 to display a virtual representation of the physical structure to which the model element corresponds. In some implementations, interactive system 220 may display a representation (e.g., a holographic representation, a stereoscopic representation, etc.) of the physical structure.

While FIG. 8 shows process 800 as including a particular quantity and arrangement of blocks, in some implementations, process 800 may include additional blocks or a different arrangement of blocks.

FIG. 9 is a flowchart of an example process 900 for modifying a model element based on an interaction with a spatial element. In some implementations, process 900 may be performed by computing device 210. In some implementations, one or more blocks of process 900 may be performed by one or more devices instead of, or possibly in conjunction with, computing device 210.

Process 900 may include detecting interaction with a spatial element that has been linked to a model element (block 910). For example, computing device 210 may receive a request, from a user associated with computing device 210, to interact with a model element, of a model, via a spatial environment. Computing device 210 may, based on receiving the request, cause TCE 215 to obtain the model and navigate to the portion of the model that includes the model element. Additionally, computing device 210 may communicate with interactive system 220 to establish an interactive session between TCE 215 and interactive system 220. The user may provide the spatial element, with which the model element is associated, into the spatial environment monitored by interactive system 220.

Upon providing the spatial element into the spatial environment, computing device 210 may receive, from interactive system 220, information associated with the spatial element. For example, computing device 210 may associate particular interactions with the spatial element as corresponding to particular actions in relation to the model element and/or attributes of the model element. As one example, assume that computing device 210 has associated a pinching motion, in relation to the spatial element in the spatial environment, with an indication that a value of a force parameter, associated with the model element, is to be decreased. Assume further that interactive system 220 detects that the user made the pinching motion and sends information, relating to the pinching motion, to computing device 210.

Process 900 may include modifying the model element based on a detected interaction (block 920). For example, computing device 210 (e.g., TCE 215) may receive interaction information from interactive system 220 and cause, in response to the received interaction information, particular actions to be performed in relation to the model element or an attribute of the model element. Further to the example given above relating to the pinching motion, computing device 210 may receive the interaction information and, in response thereto, decrease the value of the force parameter.

Systems and methods, as described herein, allow a user to link a model element, of a model of a technical computing environment, to a spatial element in a spatial environment or displayed on a graphical user interface. Using the link, the user may interact with the spatial element to navigate or modify the model. Also, the user may interact with the model element to navigate or modify the spatial element.

The foregoing description provides illustration and description, but is not intended to be exhaustive or to limit the implementations to the precise form disclosed. Modifications and variations are possible in light of the above disclosure or may be acquired from practice of the implementations. For example, while the description above focused on creating a link between a spatial element and a model element, systems and methods, as described herein, are not so limited. For example, systems and methods, as described herein, are equally applicable to creating a link between a spatial element and an attribute of a model element, such as a sample time, a dynamic system parameter, a data type, etc.

As used herein, the term component is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A non-transitory computer-readable medium for storing instructions, the instructions comprising:
   a plurality of instructions that, when executed by a processor of a computing device, cause the processor to:
   receive a request to create a link between a model element of a model and a spatial element,
   the model, when executed, simulating behavior of a system, and
   the spatial element being a physical object or an object that is rendered for display in two dimensions or three dimensions,
   the spatial element being associated with a portion of the system modeled by the model element,
   detect a user selection of the model element,
   detect a user selection of the spatial element, and
   create the link between the model element and the spatial element based on the user selection of the model element and the user selection of the spatial element,
   the link allowing:
   information associated with the spatial element to be presented based on navigation of the model to a portion of the model that includes the model element, or
   navigation of the model to the model element and presentation of the model element based on detection of the spatial element in a spatial environment.

2. The non-transitory computer-readable medium of claim 1, where the link is a Uniform Resource Locator (URL), and
   where the plurality of instructions further cause the processor to:
   cause the URL to be displayed in association with the model element.

3. The non-transitory computer-readable medium of claim 1, where the plurality of instructions that cause the processor to receive the request include:
   one or more instructions to receive the request in a technical computing environment,
   where the instructions further comprise:
   one or more instructions to provide a graphical user interface based on receiving the request, and
   one or more instructions to receive, via the graphical user interface, information identifying the model element and information identifying the spatial element,
   where the plurality of instructions that cause the processor to detect the user selection of the model element include:
   one or more instructions to detect the user selection of the model element based on the received information identifying the model element, and
   where the plurality of instructions that cause the processor to detect the user selection of the spatial element include:
   one or more instructions to detect the user selection of the spatial element based on the received information identifying the spatial element.

4. The non-transitory computer-readable medium of claim 1, where the plurality of instructions that cause the processor to receive the request include:
   one or more instructions to receive the request in a technical computing environment,
   where the plurality of instructions that cause the processor to detect the user selection of the model element include:
   one or more instructions to detect selection of the model element in the technical computing environment.

5. The non-transitory computer-readable medium of claim 1, where the spatial element is the physical object, and
   where the plurality of instructions that cause the processor to detect the user selection of the spatial element include:
   one or more instructions to detect a presence of the physical object in a spatial environment.

6. The non-transitory computer-readable medium of claim 1, where the spatial element is the physical object, and
   where the plurality of instructions that cause the processor to detect the user selection of the spatial element include:
   one or more instructions to detect selection of the physical object based on pointing to the physical object in a spatial environment.

7. The non-transitory computer-readable medium of claim 1, where the spatial element is the object that is rendered for display in two dimensions or three dimensions, and
   where the plurality of instructions that cause the processor to detect the user selection of the spatial element include:
   one or more instructions to detect selection of the object, as the object is rendered for display.

8. The non-transitory computer-readable medium of claim 1, where the spatial element is the object that is rendered for display, and
   where the plurality of instructions that cause the processor to detect the user selection of the spatial element include:
   one or more instructions to receive an image of the physical object, and
   one or more instructions to identify the physical object based on the received image.

9. The non-transitory computer-readable medium of claim 1,
   where the instructions further comprise:
   one or more instructions to detect the spatial element after the link is created, and
   one or more instructions to navigate, on a display, from a first portion of the model to a second, different portion of the model based on detecting the spatial element and based on the link,
   the second, different portion of the model including the model element.

10. The non-transitory computer-readable medium of claim 1, where the spatial element is the physical object,
    where the instructions further comprise:
    one or more instructions to detect the physical object in the spatial environment after the link is created, and
    one or more instructions to navigate, on a display, from a first portion of the model to a second, different portion of the model based on detecting the physical object in the spatial environment and based on the link,
    the second, different portion of the model including the model element.

11. The non-transitory computer-readable medium of claim 1, where the spatial element is the object that is rendered for display in two dimensions or three dimensions,
where the instructions further comprise:
one or more instructions to detect a user navigation of the model to the model element after the link is created, and
one or more instructions to present the object on a display based on detecting the user navigation of the model to the model element and based on the link.

12. A device comprising:
a processor to:
receive a request to create a link between a model element, of a model, and a spatial element,
the model, when executed, simulating behavior of a system, and
the spatial element being a physical object or an object that is rendered for display in two or more dimensions,
the spatial element being associated with a portion of the system modeled by the model element,
receive information identifying a user selection of the model element,
receive information identifying a user selection of the spatial element, and
create the link between the model element and the spatial element based on the user selection of the model element and the user selection of the spatial element,
the link allowing at least one of:
information associated with the spatial element to be presented based on navigation of the model to a portion of the model that includes the model element, or
navigation of the model to the model element and presentation of the model element based on detection of the spatial element in a spatial environment; and
a memory to store the link.

13. The device of claim 12, where, when receiving the information identifying the user selection of the spatial element, the processor is to:
detect a presence of the spatial element in a spatial environment, and
receive the information identifying the user selection of the spatial element based on detecting the presence of the spatial element in the spatial environment.

14. The device of claim 12, where the processor is further to:
receive information indicating detection of the spatial element in the spatial environment after the link is created, and
navigate, on a display, from a first portion of the model to a second, different portion of the model based on the detection of the selection of the spatial element and based on the link,
the second, different portion of the model including the model element.

15. The device of claim 12, where the spatial element is the physical object,
where the processor is further to:
receive information relating to detection of the physical object in the spatial environment after the link is created, and
navigate, on a display, from a first portion of the model to a second, different portion of the model based on detection of the physical object in the spatial environment and based on the link,
the second, different portion of the model including the model element.

16. The device of claim 12, where the spatial element is the object that is rendered for display in two or more dimensions,
where the processor is further to:
detect selection of the model element after the link is created, and
navigate to the object on a display based on detecting the selection of the model element and based on the link.

17. The device of claim 12, where the processor is further to:
cause the link to be displayed in connection with at least one of:
the model, or
the object that is rendered for display in two or more dimensions, when the spatial element is the object that is rendered for display in two or more dimensions,
the link being displayed as at least one of:
text, or
an image.

18. The device of claim 12, where the memory is further to store a plurality of links,
the plurality of links including the link,
each link, in the plurality of links, being associated with a different identifier, and
each link, in the plurality of links, associating a model element and a spatial element.

19. The device of claim 18, where the processor is further to:
provide a user with an option to perform an action,
the action including at least one of:
bookmarking one or more links in the plurality of links,
performing a search in connection with the plurality of links,
exporting one or more links in the plurality of links,
importing one or more other links into the memory,
creating the identifier associated with one or more links in the plurality of links,
accessing a history of previously-created links, or
sharing one or more links, in the plurality of links, with another user,
receive a selection of the option, and
perform the action.

20. A method comprising:
receiving a request to create a link between a model element, of a model, and a spatial element,
the model, when executed, simulating behavior of a system,
the spatial element being a physical object or an object that is rendered for display in two or more dimensions,
the spatial element being associated with a portion of the system modeled by the model element, and
the receiving the request being performed by a computing device;
receiving information identifying a user selection of the model element, the receiving the information identifying the user selection of the model element being performed by the computing device;
receiving information identifying a user selection of the spatial element, the receiving the information identifying the user selection of the spatial element being performed by the computing device;
creating the link between the model element and the spatial element based on the user selection of the model element and the user selection of the spatial element, the creating the link being performed by the computing device; detecting the spatial element subsequent to creating the link,
the detecting the spatial element being performed by the computing device; and
causing, based on detecting the spatial element and based on the link, the model element to be displayed,
the causing the model element to be displayed being performed by the computing device.

21. The method of claim 20, where the link includes a Uniform Resource Locator (URL),
where the spatial element corresponds to the object that is rendered for display in two or more dimensions,
where the method further comprises:
causing the URL to be displayed in association with the object, and
where detecting the spatial element includes:
detecting selection of the URL.

22. The method of claim 20, where detecting the spatial element includes:
detecting a presence of the spatial element in a spatial environment.

23. The method of claim 20, where the spatial element visually resembles a physical structure of the system to which the model element corresponds.

24. The method of claim 20, where the link is associated with information that indicates a manner in which the spatial element is to be displayed,
the manner including at least one of:
a viewing angle of the spatial element,
a scale of the spatial element,
a coloring of the spatial element, or
a transparency of the spatial element.

* * * * *